(12) United States Patent
Syau et al.

(10) Patent No.: US 7,582,567 B1
(45) Date of Patent: Sep. 1, 2009

(54) METHOD FOR FORMING CMOS DEVICE WITH SELF-ALIGNED CONTACTS AND REGION FORMED USING SALICIDE PROCESS

(75) Inventors: Tsengyou Syau, Portland, OR (US); Shih-Ked Lee, Fremont, CA (US); Chuen-Der Lien, Los Altos Hills, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 621 days.

(21) Appl. No.: 11/424,333

(22) Filed: Jun. 15, 2006

Related U.S. Application Data

(63) Continuation of application No. 10/874,980, filed on Jun. 22, 2004, now Pat. No. 7,098,114.

(51) Int. Cl.
*H01L 21/302* (2006.01)
(52) U.S. Cl. .................. 438/706; 438/700; 438/717; 438/595
(58) Field of Classification Search .......... 438/700, 438/702, 706, 717, 721, 723, 724, 725, 595, 438/634, 640
See application file for complete search history.

(56) References Cited

U.S. PATENT DOCUMENTS

| | | | | |
|---|---|---|---|---|
| 4,897,703 A | * | 1/1990 | Spratt et al. | 257/586 |
| 5,792,684 A | * | 8/1998 | Lee et al. | 438/238 |
| 6,159,839 A | * | 12/2000 | Jeng et al. | 438/618 |
| 6,214,658 B1 | * | 4/2001 | Niuya | 438/233 |
| 6,376,298 B1 | * | 4/2002 | Li et al. | 438/238 |
| 6,559,501 B2 | * | 5/2003 | Sung et al. | 257/316 |
| 6,972,250 B2 | * | 12/2005 | Cabral et al. | 438/618 |
| 7,125,775 B1 | * | 10/2006 | Wang et al. | 438/283 |
| 7,163,881 B1 | * | 1/2007 | Chen et al. | 438/595 |
| 2005/0093147 A1 | * | 5/2005 | Tu | 257/734 |
| 2005/0118757 A1 | * | 6/2005 | Cabral et al. | 438/199 |

* cited by examiner

*Primary Examiner*—Kin-Chan Chen
(74) *Attorney, Agent, or Firm*—Kenneth Glass; Glass & Associates

(57) ABSTRACT

A method for forming CMOS devices on a semiconductor substrate is disclosed in which gate structures are formed within both the core region and the non-core region of the semiconductor substrate. The gate structures include a gate dielectric layer and a gate film stack that includes a conductive layer and an overlying hard mask. The hard mask is then removed from the gate structures in the non-core region. A salicide process is then performed so as to form a silicide layer in the non-core region. A barrier layer is formed that extends over the core region and a pre-metal dielectric film is formed that extends over the barrier layer. A selective etch process is performed so as to form self-aligned contact openings that extend through the pre-metal dielectric film and through the barrier layer in the core region. These openings are then filled with conductive material to form self-aligned contacts in the core region. This produces a CMOS device in the core region that has high device density and includes high-speed CMOS devices the non-core region.

20 Claims, 22 Drawing Sheets

METHOD FOR FORMING CMOS DEVICE WITH SELF-ALIGNED CONTACTS AND REGION FORMED USING SALICIDE PROCESS

CROSS REFERENCE TO RELATED APPLICATIONS

This application is a continuation of, and claims priority to, U.S. patent application Ser. No. 10/874,980 filed on Jun. 22, 2004 now U.S. Pat. No. 7,098,114, which is incorporated herein by reference.

FIELD OF THE INVENTION

The present invention relates to the field of semiconductor devices. More particularly, the present invention relates to Complimentary Metal-Oxide Semiconductor (CMOS) devices and processes for forming CMOS devices on a semiconductor substrate.

BACKGROUND ART

In sub-micron Complimentary Metal-Oxide Semiconductor (CMOS) manufacturing self-aligned contact (SAC) technology has been successfully used to achieve chip size reduction. In conventional SAC processes structures that are to be connected with overlying layers using a self-aligned contact are closely spaced on the semiconductor substrate. A silicon nitride barrier layer is formed over the structure that is to be contacted. A pre-metal dielectric film of oxide or doped oxide is then deposited over the barrier layer. A selective etch is then performed to form contact openings that extend through the pre-metal dielectric layer. This etch stops on the barrier layer. The exposed portions of the barrier layer are then removed, exposing the structure that is to be contacted. A metal layer is then deposited and planarized to complete the self-aligned contact. The etch stop layer prevents over-etch, aligning the contact with the structure to be contacted and preventing current leakage that could result from improper alignment.

SAC processes allow for the formation of closely spaced structures, giving high density semiconductor devices. However, the speed of devices formed with SAC processes is significantly less than the speed of devices formed with non-SAC processes. Accordingly, there is a need for CMOS devices that have both high density and high speed. Also, there is a need for a process for forming CMOS devices that have both high density and high speed. The present invention meets the above needs.

DISCLOSURE OF THE INVENTION

The present invention provides for forming complimentary metal oxide semiconductor (CMOS) devices that include self-aligned contacts in a core region of a semiconductor substrate and devices in a non-core region of the semiconductor substrate that are formed using a salicide process. This produces CMOS devices that have the advantages of both high density (in the core region) and increased device speed (in the non-core region).

A method for forming CMOS devices on a semiconductor substrate is disclosed in which gate structures are formed within both the core region and the non-core region of the semiconductor substrate. The gate structures include a gate dielectric layer and a gate film stack that includes a conductive layer and an overlying hard mask. The hard mask is then removed from the gate structures in the non-core region. A salicide process is performed so as to form a silicide layer in the non-core region that includes silicide segments that overlie source regions, drain regions and gate structures in the non-core region.

A barrier layer is formed that extends over the core region and a pre-metal dielectric film is formed that extends over the barrier layer. Self-aligned contact openings are formed that extend through the pre-metal dielectric film and through the barrier layer in the core region. These openings are then filled with conductive material to form self-aligned contacts within the core region.

In the present embodiment the gate structures in the core region are more closely spaced than the gate structures in the non-core region, producing CMOS devices in the core region that have high density. The use of a salicide process in the non-core region gives devices in the non-core region that have high speed. Accordingly, the present invention provides for forming CMOS devices having high density in the core region and CMOS devices in the non-core region having high speed.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

FIGS. 1-10 illustrate a method for forming CMOS devices that include self-aligned contacts in a first region of a semiconductor substrate (core region) and CMOS devices in a second region (non-core region) of the semiconductor substrate that are formed using a salicide process. The term "self-aligned contact" includes those types of contact structures that are formed using a self-aligned contact process and specifically includes contact structures that are formed using a first dielectric layer (hereinafter referred to as a "barrier layer") that overlies the structure to be contacted and a pre-metal dielectric layer that overlies the barrier layer, when a selective etch is used to form a contact opening that extends through the pre-metal dielectric layer and a second etch is used to remove exposed portions of the barrier layer, so as to properly locate the self-aligned contact opening.

Figure 1:
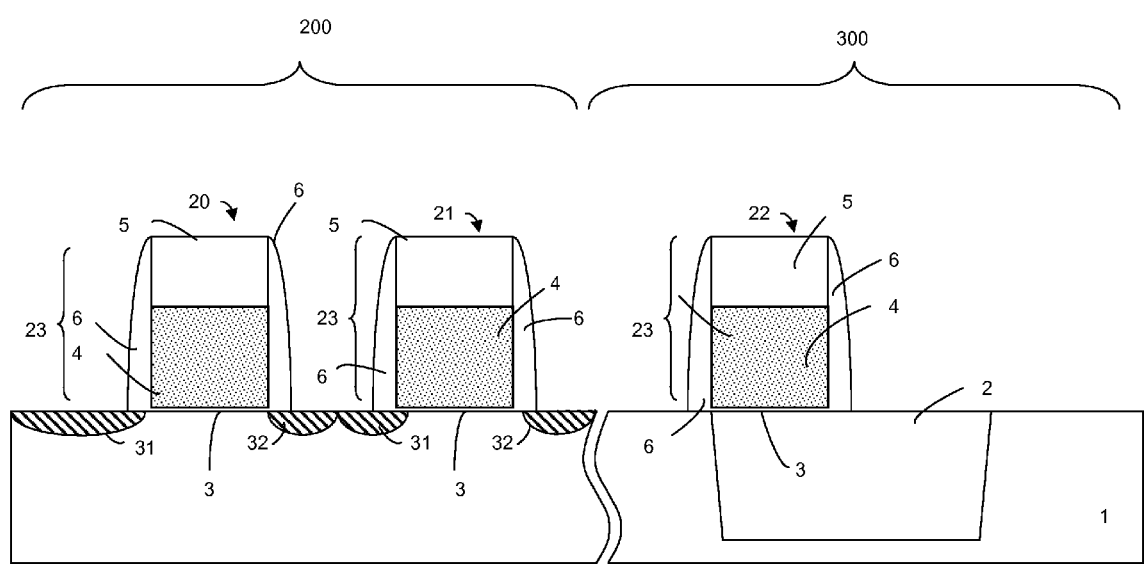
FIG. 1 shows a semiconductor substrate having gate structures formed thereon, with some gate structures formed in a core region and some gate structures formed in a non-core region in accordance with an embodiment of the present invention.

Referring to FIG. 1, gate structures 20-22 are formed within core region 200 and non-core region 300 of semiconductor substrate 1. Semiconductor substrate 1 can be either N or P type and can include isolation regions (e.g., using shallow trench isolation processing steps) depending on the device requirements. In the present embodiment shallow trench isolation processing steps are performed so as to form shallow trench isolation region 2 in semiconductor substrate 1. Shallow trench isolation region 2 can be formed by masking and etching semiconductor substrate 1 to form trenches. These trenches are then filled with one or more layers of oxide which are then planarized.

Gate structures 20-22 can be formed by depositing or growing a layer of dielectric material 3 over semiconductor substrate 1. Dielectric layer 3 can be formed by depositing or growing a thin layer (e.g., 10 to 80 Angstroms) of silicon dioxide ($SiO_2$) or other type of dielectric on semiconductor substrate 1. Each of gate structures 20-22 includes a gate film stack 23 that includes a conductive layer 4 and a hard mask 5. Conductive layer 4 includes one or more layers of conductive material that immediately overlies dielectric layer 3. In the present embodiment conductive layer 4 is a single layer of undoped polysilicon that has a thickness of approximately 500-2000 Angstroms and that is deposited using a chemical vapor deposition process. Alternatively, conductive layer 4 can be formed by depositing amorphous silicon in a furnace.

Implant process steps are then performed so as to implant species within core region 200 as required to meet device and integration requirements. In the present embodiment non-core region 300 is covered with a resist mask and an N type dopant is implanted such that only that portion of conductive layer 4 within core region 200 is doped, producing an N type conductive layer 4 within core region 200.

In the present embodiment hard mask 5 is formed by depositing one or more layers of dielectric material immediately over conductive layer 4. In one embodiment hard mask 5 is formed of a single layer of oxide, nitride or oxynitride ($SiO_xN_y$) having a thickness from 500 to 2500 Angstroms. In another embodiment hard mask 5 includes multiple layers of material, with individual layers formed of oxide, nitride or oxynitride. However, hard mask 5 can be formed of any other dielectric material that can protect underlying conductive layer 4 during the etch of self-aligned contact openings such that the subsequently formed self-aligned contact will not short to a gate electrode.

In the present embodiment gate structures 20-22 are formed simultaneously in both core region 200 and non-core region 300 by depositing dielectric layer 3 conductive layer 4 and hard mask 5 over substrate 1 such that dielectric layer 3, conductive layer 4 and hard mask 5 extend over the entire semiconductor substrate. A layer of photoresist is deposited, exposed and developed so as to form a resist mask that overlies hard mask 5. An etch step is then performed to pattern hard mask 5. The remaining resist mask is removed. The hard mask 5 serves as a mask to pattern conductive layer 4 and a layer of dielectric material is deposited and etched to form spacers 6. In the present embodiment spacers 6 are formed by depositing 200-1000 Angstroms of silicon nitride (SiN) which is etched using a reactive ion etch process. This gives gate structures 20-22 that are identical and that extend at the same time within both core region 200 and non-core region 300.

In the present embodiment, after gate structures 20-22 are completed, masking and implantation steps are performed so as to form source and drain regions 31-32 within core region 200. Though each of source and drain regions 31-32 are shown to be separate structures in FIGS. 1-22, it is appreciated that source and drain regions 31-32 that are common between adjoining devices, such as source and drain regions 31-32 that extend between gate structures 20-21 will be a single common structure that extends between gate structures 20-21.

Hard mask 5 is then removed from gate structures in non-core region 300. In the embodiment shown in FIGS. 2-5 hard mask 5 is removed from gate structure 22 by first depositing sacrificial dielectric film 8 over gate structures 20-22. In the present embodiment dielectric film 8 includes one or more layers dielectric material, with individual layers formed of doped oxide, borophosphosilica glass (BPSG), undoped silica glass (USG), spin on glass (SOG), borosilica glass (BSG), phosphosilicate glass (PSG) or tetraethylorthosilicate (TEOS). In one specific embodiment a chemical mechanical polishing process is used to planarize the deposited dielectric material so as to form a planarized dielectric film 8 having a thickness of from 0 to 3000 Angstroms over the top of gate structures 20-22.

A layer of photoresist is then deposited, exposed and developed to form resist mask 9a. In the present embodiment all of core region 200 is covered by resist mask 9a while all of non-core region 300 is exposed.

Figure 2:
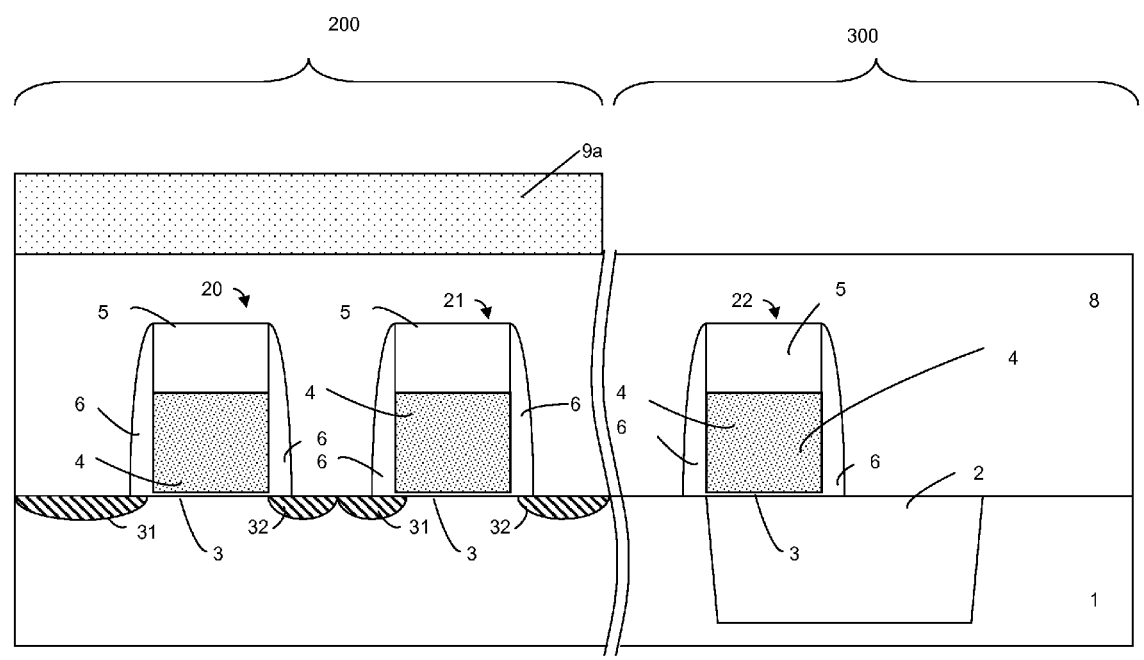
FIG. 2 shows the structure of FIG. 1 after a dielectric film and a resist mask have been formed thereover in accordance with an embodiment of the present invention.
Figure 3:
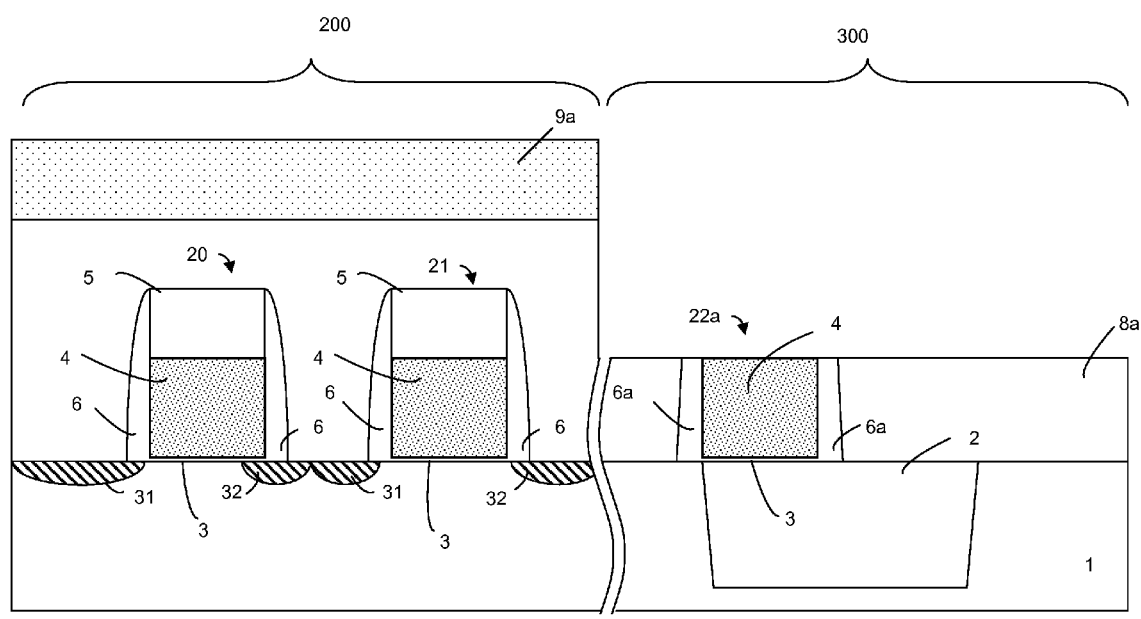
FIG. 3 shows the structure of FIG. 2 after an etch has been performed so as to expose the top surface of the conductive layer of gates within the non-core region in accordance with an embodiment of the present invention.

An etch step is performed so as to remove hard mask 5 from gate structure 22 in non-core region 300, exposing conductive layer 4 of each gate structure 22 in non-core region 300. Referring now to FIG. 2, the etch process removes some of that portion of dielectric layer 8 that is not covered by resist mask 9a, leaving remaining dielectric layer 8a. Also, the etch process removes the tops of those spacers 6 that are not covered by resist mask 9a, leaving remaining spacers 6a. In the present embodiment a selective etch process is used that will preferentially remove dielectric film 8 and hard mask 5 over conductive layer 4. In one embodiment a plasma or dry etch process is used that will stop at the top surface of conductive layer 4. This etch can be a fluorine based etch (performed in a dielectric-etch chamber) that uses tetrafluoromethane ($CF_4$) and/or other fluorine-based chemistries (e.g., $CHF_3$, $O_2$, Ar, $C_4F_8$, $C_5F_8$, $N_2$, $CH_2F_2$, $CH_3F$, CO, $C_2HF_5$, and $C_2F_6$) that is tuned to obtain a high etch rate of doped oxide (dielectric film 8) and oxynitride (hard mask 5), and a low etch rate of polysilicon (conductive layer 4). The etch selectivity to the material in dielectric film 8 relative to the material in hard mask 5 is tuned so as to obtain a desired amount of remaining dielectric film 8a. In one embodiment an etch chemistry is used that is tuned to preferentially etch remaining dielectric film 8a such that remaining dielectric film 8a extends below the top surface of conductive layer 4. Alternatively, an etch can be used that is tuned to preferentially etch hard mask 5 over remaining dielectric film 8a so as to form remaining dielectric film 8a that extends above the top surface of conductive layer 4.

Following the removal of resist mask 9a and dielectric film 8a implant process steps are performed so as to implant species within non-core region 300 as required to meet device and integration requirements. In the present embodiment non-core region 300 is covered with one or more photoresist mask and both N type and P type dopants are implanted so as to form both N type gate structures and P type gate structures, and to form source and drain regions 33-34 within non-core region 300. In the present embodiment the implantation of species into gate structure 22a is performed after the etch of dielectric layer 8 and the etch of dielectric layer 8 is tuned such that remaining dielectric film 8a extends above the top of conductive layer 4. Remaining dielectric film 8a stops implant species from entering substrate 1 or shallow trench isolation region 2 during implant steps for doping gate structure 22a. Source and drain implant steps are performed so as to form source and drain regions 33-34. Source and drain implant steps can be performed either before the deposition of dielectric film 8 or after the removal of dielectric film 8a. Alternatively, source and drain implant steps can be performed at the same time as the implantation of core region 200.

Figure 4:
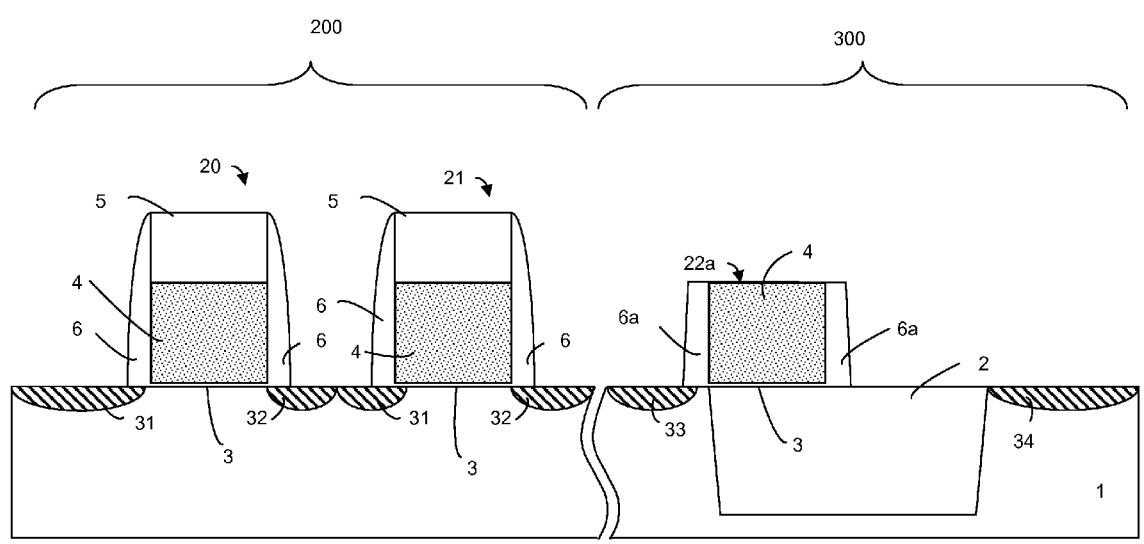
FIG. 4 shows the structure of FIG. 3 after removal of the resist mask, after removal of the remaining dielectric film, and after implant process steps have been performed in accordance with an embodiment of the present invention.
Figure 5:
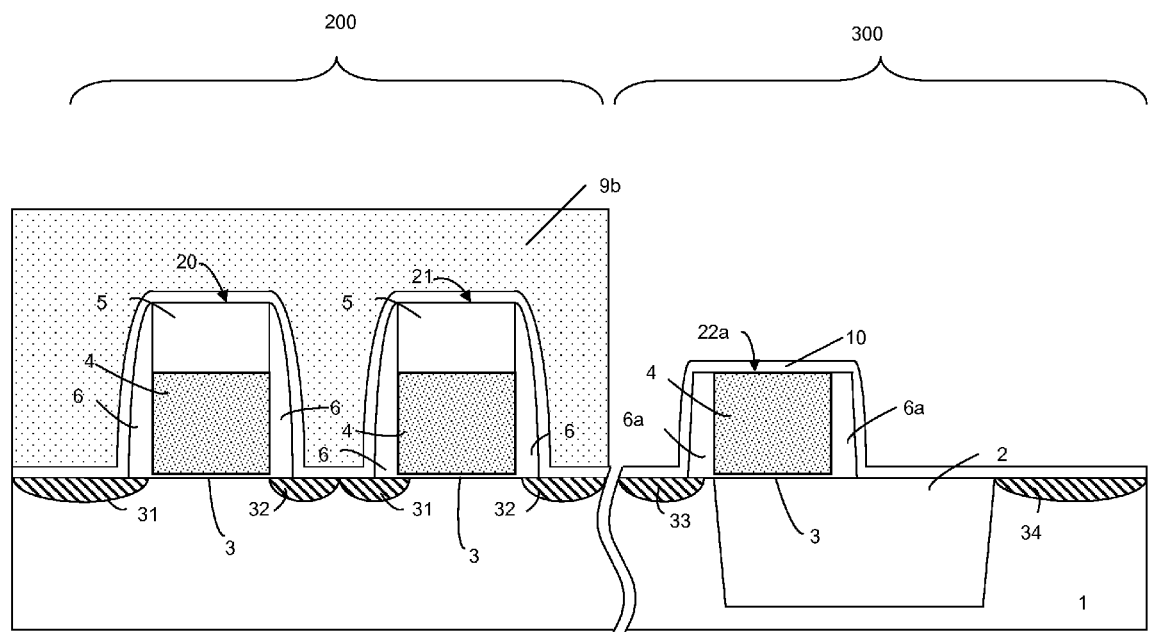
FIG. 5 shows the structure of FIG. 4 after a protective layer has been formed thereover, and after a resist mask has been formed that covers all of the core region and that exposes all of the non-core region in accordance with an embodiment of the present invention.
Figure 6:
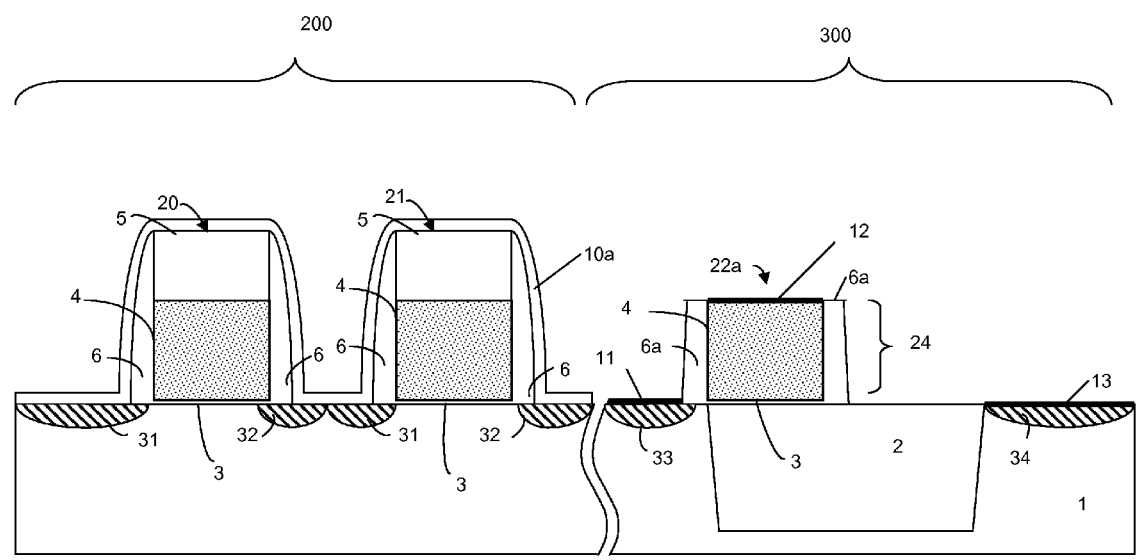
FIG. 6 shows the structure of FIG. 5 after an etch has been performed, after removal of the resist mask and after a salicide process has been performed in accordance with an embodiment of the present invention.

Remaining dielectric film 8a is then removed so as to form the structure shown in FIG. 4. In the present embodiment remaining dielectric film 8a is removed using a wet etch process that will preferentially etch remaining dielectric film 8a over semiconductor 1 and the structures formed on semiconductor 1 (spacers 6-6a, hard mask 5, conductive layer 4, and shallow trench isolation region 2. In one embodiment a dilute HF or buffered oxide etch (BOE) solution is used so as to obtain a high etch rate of doped oxide (remaining dielectric layer 8a) and a very low etch rate of: silicon (substrate 1), silicon nitride (spacers 6-6a), nitride (hard mask 5), polysilicon (conductive layer 4), and undoped oxide (shallow trench isolation region 2).

In the embodiment shown in FIGS. 5-10 core region 200 is covered using a thin protective layer 10. In one embodiment protective layer 10 is a layer of oxide having a thickness of from 100 to 500 Angstroms that is deposited immediately over gate structures 20-21, remaining spacers 6a and conductive layer 4. Protective layer 10 is then patterned using resist mask 9b. In one embodiment resist mask 9b is identical to etch mask 9a, covering all of core region 200 and exposing all of non-core region 300. In the present embodiment a wet etch is performed so as to remove all of protective layer 10 that extends within non-core region 300, leaving remaining protective layer 10a that covers all of core region 200.

After the removal of resist mask 9b a salicide process is performed so as to form a silicide layer in non-core region 300. In the present embodiment the salicide process includes depositing a layer of metal (e.g., a refractory metal) over semiconductor substrate 1 and performing an anneal process to form a silicide layer that includes silicide segments 11-13. Remaining protective layer 10a covers core region 200 during the salicidation process, preventing the formation of silicide in core region 200. The salicide process completes gate structure 22a by forming a gate electrode 24 that includes silicide segment 12 and conductive layer 4. In addition, the salicide process forms silicide segment 11 on one side of gate structure 22a and silicide segment 13 on the opposite side of gate structure 22a. In one embodiment silicide segments 11-13 have a thickness of from 200 to 1000 Angstroms and are formed by depositing and annealing cobalt so as to form cobalt silicide. Alternatively the silicide can be formed using tungsten, titanium, tantalum, molybdeum, niobium, rhenium, vanadium, chromium, zirconium, hafnium, or any other metal that produces a metal silicide having good conductivity.

Figure 7:
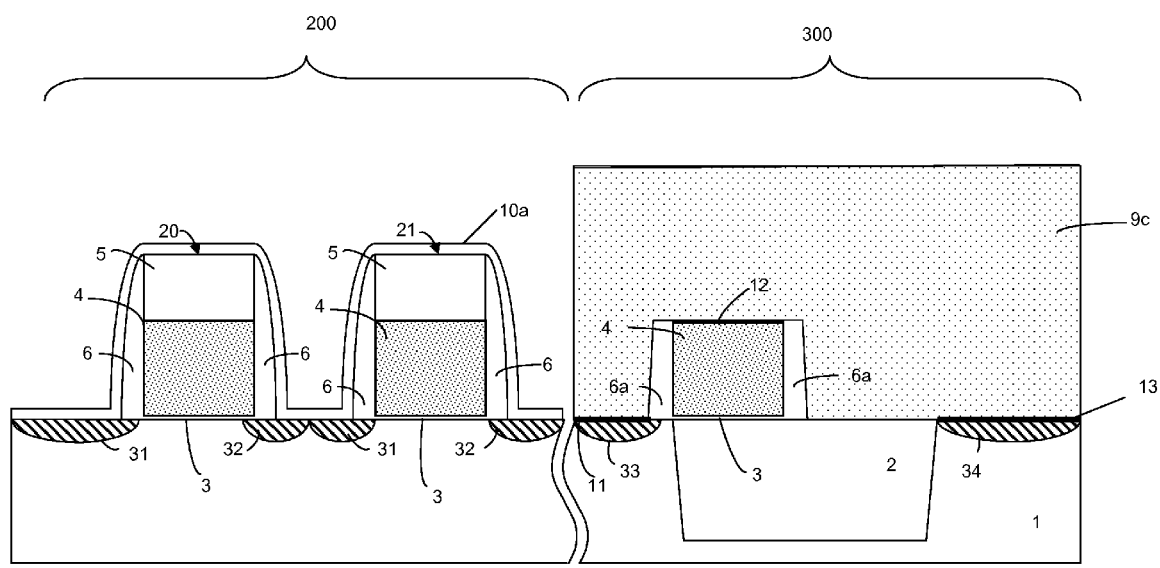
FIG. 7 shows the structure of FIG. 6 after a resist mask has been formed thereover that covers all of the non-core region and exposes all of the core region in accordance with an embodiment of the present invention.

In the embodiment shown in FIGS. 7-10 remaining protective layer 10a is removed. Referring now to FIG. 7, resist mask 9c is formed that covers non-core region 300, exposing remaining protective layer 10a. Resist mask 9c can be formed using a reverse tone mask of the mask used to form resist mask 9a or resist mask 9b or by using the same mask and a negative resist. An etch process is then performed to remove all of remaining protective layer 10a. In one embodiment remaining protective layer 10a is removed using a wet etch process that will preferentially etch remaining protective layer 10a over semiconductor 1 and the other structures formed on semiconductor 1 (spacers 6, hard mask 5, conductive layer 4, and hard mask 5). In one embodiment a dilute HF or buffered oxide etch (BOE) solution is used so as to obtain a high etch rate of oxide (remaining protective layer 10a) and a very low etch rate of silicon (substrate 1), silicon nitride (spacers 6 and hard mask 5).

Resist mask 9c is removed and a layer of dielectric material, shown as barrier layer 7, is formed over semiconductor substrate 1 such that barrier layer 7 extends over both core region 200 and non-core region 300. Barrier layer 7 can be one or more layers of dielectric material, with each layer formed of silicon nitride, silicon oxide, silicon oxynitride, or other dielectric material that can act as an etch stop relative to the material in pre-metal dielectric film 14. In one specific embodiment barrier layer 7 is a single layer of nitride that has a thickness of from 100-500 Angstroms and that extends over the entire semiconductor substrate.

Figure 8:
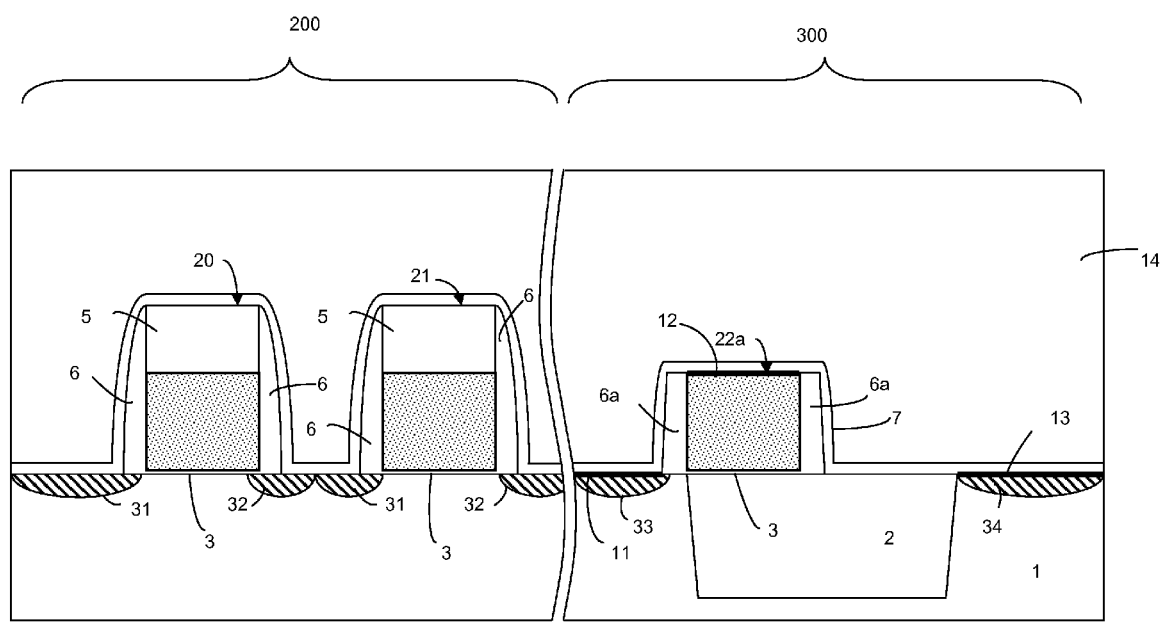
FIG. 8 shows the structure of FIG. 7 after a selective etch has been performed to remove the remaining protective layer, after removal of the resist mask, and after a barrier layer and a dielectric film have been formed in accordance with an embodiment of the present invention.

Referring now to FIG. 8, a pre-metal dielectric film 14 is then formed over barrier layer 7. In the present embodiment dielectric film 14 extends over the entire semiconductor substrate and has a thickness such that it extends from 1000 to 4000 Angstroms over gate structures 20-21. Pre-metal dielectric film 14 can be one or more layers of dielectric material, with each layer formed of doped oxide, BPSG, BSG, PSG, USG, TEOS, oxynitride or other dielectric material that can be selectively etched relative to the material in barrier layer 7.

In one specific embodiment a pre-metal dielectric film 14 is formed that has a hard, planar upper surface. In this embodiment one or more layers of soft conformal dielectric material such as doped oxide, BPSG, USG, BSG, PSG or some combination of these materials, are deposited to form a dielectric film that is planarized using a chemical mechanical polishing process. One or more layers of relatively hard dielectric material such as TEOS and/or silicon oxynitride are then deposited to form the hard upper surface.

Figure 9:
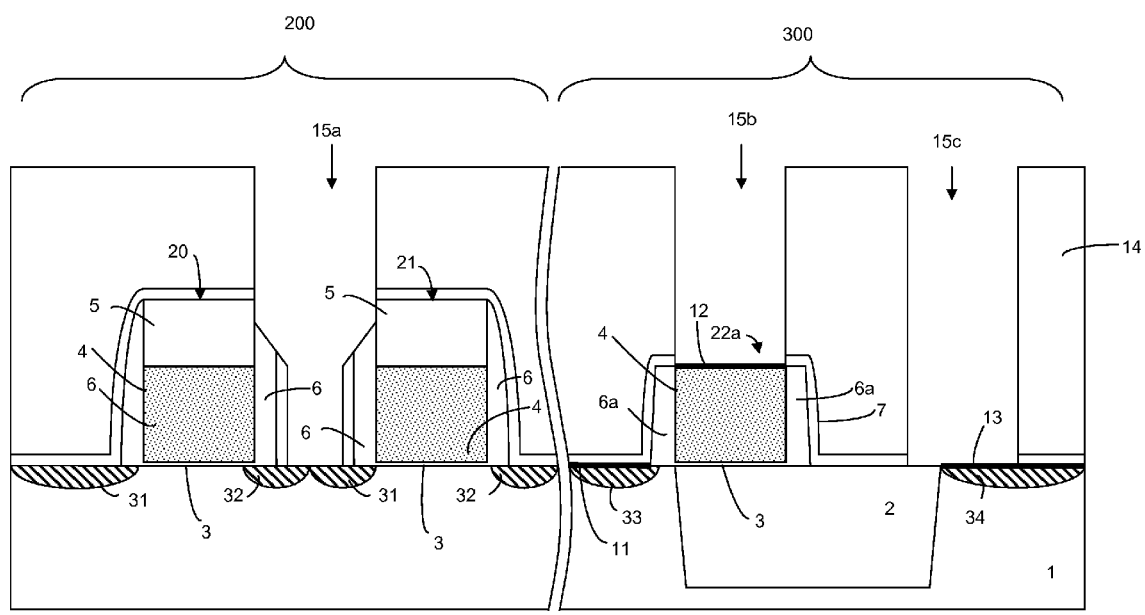
FIG. 9 shows the structure of 8 after mask and etch steps have formed openings that extend through the dielectric film and through the barrier layer so as to form self-aligned contact openings within the core region that expose source and drain regions in the core region, and so as to form openings within the non-core region in accordance with an embodiment of the present invention.

A selective etch process is performed to form self-aligned contact openings that are then filled with conductive material to form self-aligned contacts in core region 200. Referring now to FIG. 9, in the present embodiment openings are formed within both core region 200 and non-core region 300. In one embodiment multiple mask and etch processes are used to form openings that define the contacts to gate electrodes, source regions and drain regions 31-34 within core region 200 and non-core region 300. In one embodiment a first mask is used to define self-aligned contact openings that connect to source and drain structures in core region 200 (e.g., opening 15a), a second mask is used to define conventional (non-self aligned) contact openings to source, drain and gate structures (e.g., openings 15 b-c) in non-core region 300, while a third mask is used to define conventional contact openings contacts (not shown) to gate structures 20-21 in core region 200.

Openings 15a-c extend through pre-metal dielectric film 14 and barrier layer 7. Opening 15a is shown to expose a region of substrate 1 that extends between gate structures 20-21 that includes source and a drain regions 31-32. Opening 15b exposes silicide segment 12 and opening 15c exposes silicide segment 13. It is appreciated that the openings shown are exemplary and that openings will also be formed to expose conductive layer 4 of each of gate structures 20-21 within core region 200.

In the present embodiment a two-step etch process is used to form self-aligned contact opening 15a. The first etch process is a selective etch that etches through pre-metal dielectric film 14 and stops on barrier layer 7. In the present embodiment this first etch uses fluorine based chemistry (e.g., $C_4F_8$, $C_5F_8$, $C_2HF_5$) that is tuned to obtain a high etch rate of oxide (pre-metal dielectric layer 14) and a low etch rate of silicon nitride (barrier layer 7 and hard mask 5). A second selective etch process is then used to extend the opening through layer 7. The second etch can be a highly selective dry etch that preferentially etches barrier layer 7 while minimally etching pre-metal dielectric film 14. In one embodiment a dry etch is used (for example, a dry etch that uses $CHF_3$ and $O_2$, $CH_3F$) that is tuned to obtain a high etch rate of silicon nitride and a low etch rate of oxide so as to remove the exposed portion of barrier layer 7 while only minimally removing material from pre-metal dielectric film 14. This same two-step process can be used to form openings 15b-c as well. However, preferably a single etch is used that will etch through both pre-metal dielectric layer 14 and barrier layer 7. This can be a dielectric etch that uses fluorine based chemistry (e.g., $C_4F_8$, $C_5F_8$, $C_2HF_5$, $CF_4$, $CHF_3$, $CH_3F$) and that is tuned to etch both oxide and silicon nitride.

Figure 10:
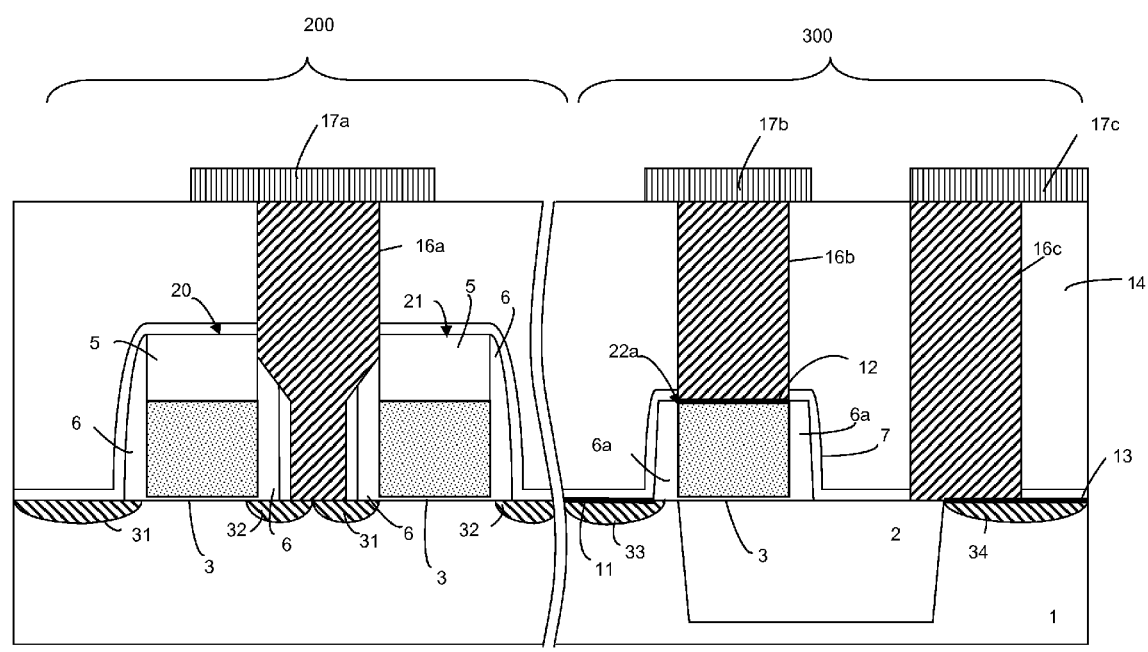
FIG. 10 shows the structure of FIG. 9 after self-aligned contacts have been formed in the self-aligned contact openings, after non-self aligned contacts have been formed in the openings in the non-core region, and after interconnects have been formed thereover in accordance with an embodiment of the present invention.

Openings 15a-c are then filled with conductive material so as to form self-aligned contact 16a and conventional (non-self-aligned) contacts 16b-16c shown in FIG. 10. In one embodiment contacts 16a-16c are formed by depositing tungsten into openings 15a-c and performing a chemical mechanical polishing process to obtain a planar top surface. In one embodiment contacts 16a-16c are formed by depositing multiple layers of conductive material that are then planarized to form contacts 16a-c. A chemical mechanical polishing process, or a combination of a reactive ion etch and a chemical mechanical polishing process can then be used to form contacts 16a-c having a planar top surface.

The etch process for forming opening 15a preferentially etches the material in pre-metal dielectric layer 14 over the material in spacer 6 and barrier layer 7, aligning opening 15a with the region of substrate 1 that extends between gate structure 20 and gate structure 21 such that contact 16a is a self-aligned contact. In the present embodiment all of the contacts that couple to source and drain regions in core region 200 are self-aligned contacts, and all contacts that couple to gate structures in core region 200 are conventional contacts (not shown).

Interconnects are then formed by depositing and patterning a layer of conductive material such that the remaining conductive material makes electrical contact with contacts 16a-c. In the embodiment shown in FIG. 10, a layer of titanium nitride is deposited, masked and etched to form interconnects 17a-c that electrically couple to contacts 16a-c. Alternatively, interconnects 17a-c can be formed of other conductive materials such as, for example, tungsten, aluminum, copper, copper/aluminum alloy or copper aluminum/titanium nitride alloy.

Figure 11:
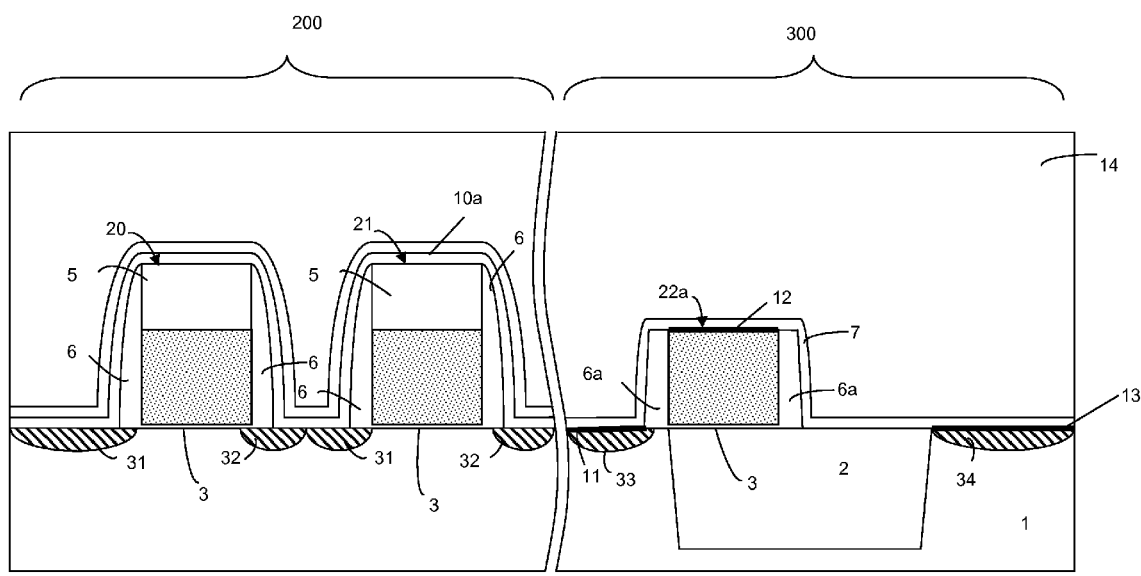
FIG. 11 shows the structure of FIG. 6 after a barrier layer and a dielectric film have been formed over both the core region and the non-core region in accordance with an embodiment of the present invention.
Figure 12:
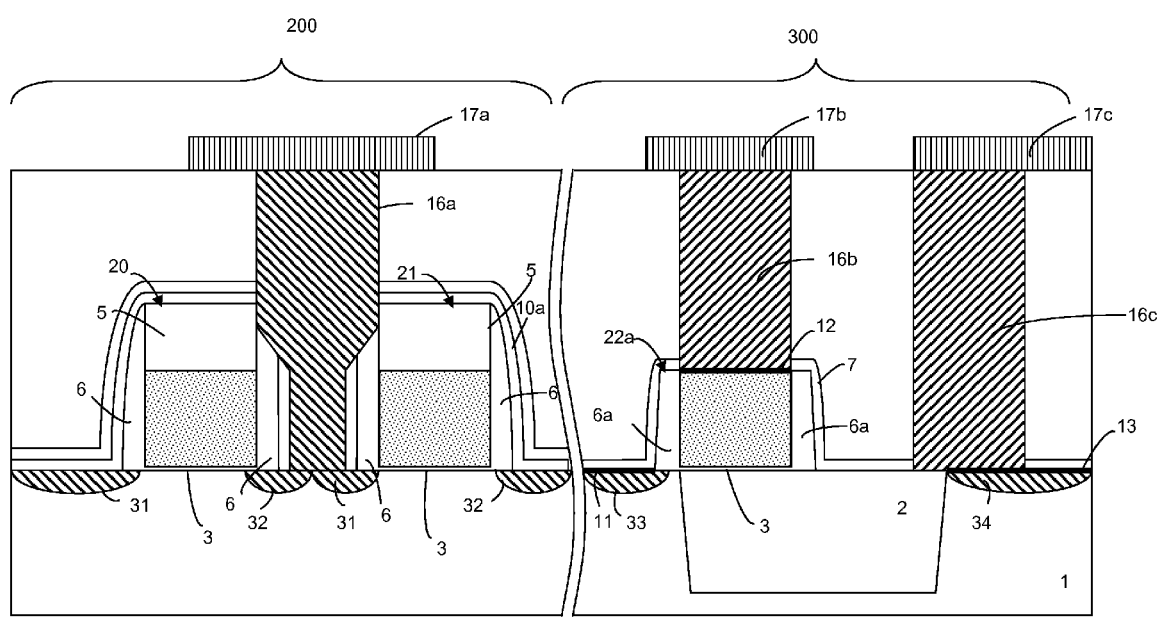
FIG. 12 shows the structure of FIG. 11 after self-aligned contacts have been formed that couple to source and drain regions in the core region, after non-self aligned contacts have been formed the non-core region, and after interconnects have been formed thereover in accordance with an embodiment of the present invention.

FIGS. 11-12 illustrate a method for forming CMOS devices that include self-aligned contacts in core region 200 and forming CMOS devices in non-core region 300 using a salicide process, in which remaining protective layer 10a is not removed. In this embodiment the steps illustrated in FIGS. 1-6 are performed so as to form the structure shown in FIG. 6. Barrier layer 7 and pre-metal dielectric film 14 are then formed over semiconductor substrate 1 so as to give the structure shown in FIG. 11. In this embodiment, within core region 200, remaining protective layer 10a will extend between gate structures 20-21 and barrier layer 7. Openings 15a-c, contacts 16a-c and interconnects 17a-c are then formed. In the present embodiment the same methods and materials are used to form barrier layer 7, pre-metal dielectric film 14, contact openings 15a-c, contacts 16a-c and interconnects 17a-c as are used in the embodiment shown in FIGS. 8-10, giving the structure shown in FIG. 12.

Though the embodiment illustrated in FIGS. 11-12 saves a masking step (resist mask 9c) and an etch step (to remove remaining protective layer 10a), depending on the material used to form pre-metal dielectric film 14, barrier layer 7 and remaining protective layer 10a, a different etch process may have to be used to form opening 15a. More particularly, when a two-step etch process is used that includes a first etch that etches through pre-metal dielectric film 14 and a second etch that etches through barrier layer 7 and remaining protective layer 10a, the second etch chemistry may have to be tuned such that both the material in pre-metal dielectric film 14 and remaining protective layer 10a will be removed. Alternatively, a three-step etch process can be used, with the first etch removing pre-metal dielectric film 14, the second etch removing layer 7, and the third etch removing remaining protective layer 10a. In the present embodiment the third etch is a dry etch that preferentially etches the material in remaining protective layer 10a over the material in barrier layer 7. In one embodiment an oxide etch is performed that has a high etch rate of oxide (protective layer 10a) and a low etch rate of SiN and/or SiON (barrier layer 7).

Figure 13:
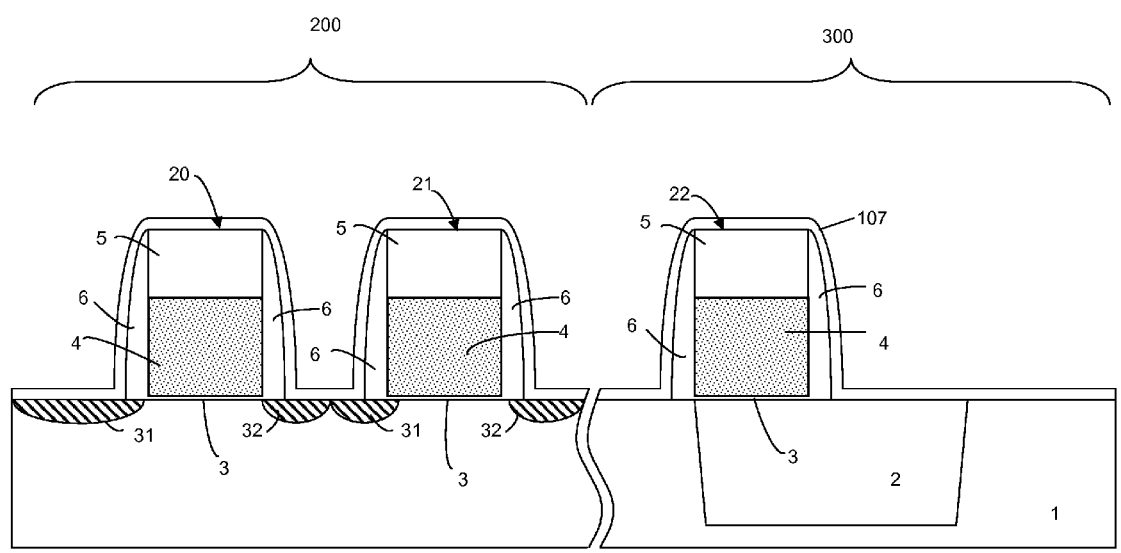
FIG. 13 shows the structure of FIG. 1 after a barrier layer has been formed thereover in accordance with an embodiment of the present invention.

FIGS. 13-18 illustrate a method for forming CMOS devices that include self-aligned contacts in core region 200 and forming CMOS devices in non-core region 300 using a salicide process, in which a dielectric barrier layer 107 is used to block salicidation. In this embodiment gate structures 20-22 and source and drain structures 31-32 are formed in the same manner as illustrated in FIG. 1. Referring now to FIG. 13, barrier layer 107 is formed over semiconductor substrate 1 such that barrier layer 107 extends within both core region 200 and non-core region 300. Barrier layer 107 can be one or more layers of dielectric material, with each layer formed of silicon nitride, silicon oxide, silicon oxynitride, or other dielectric material that can act as an etch stop relative to the material in pre-metal dielectric film 114. In one embodiment barrier layer 107 is a single layer of nitride that has a thickness of from 100-500 Angstroms.

Figure 14:
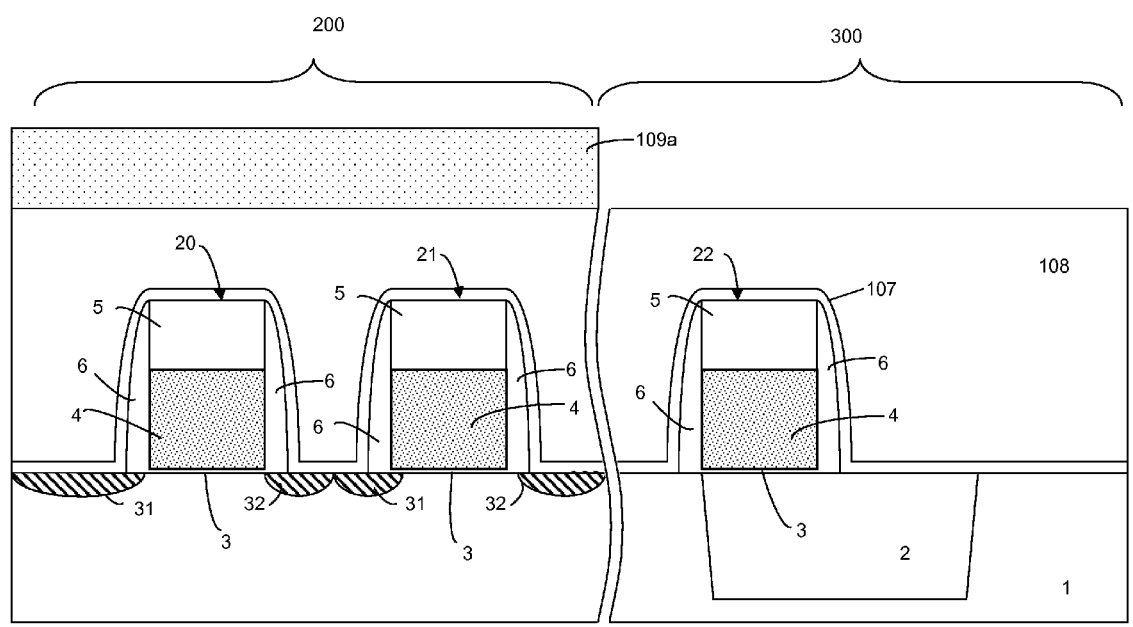
FIG. 14 shows the structure of FIG. 13 after dielectric film has been formed thereover and after a resist mask has been formed that covers all of the core region and has exposed all of the non-core region in accordance with an embodiment of the present invention.
Figure 15:
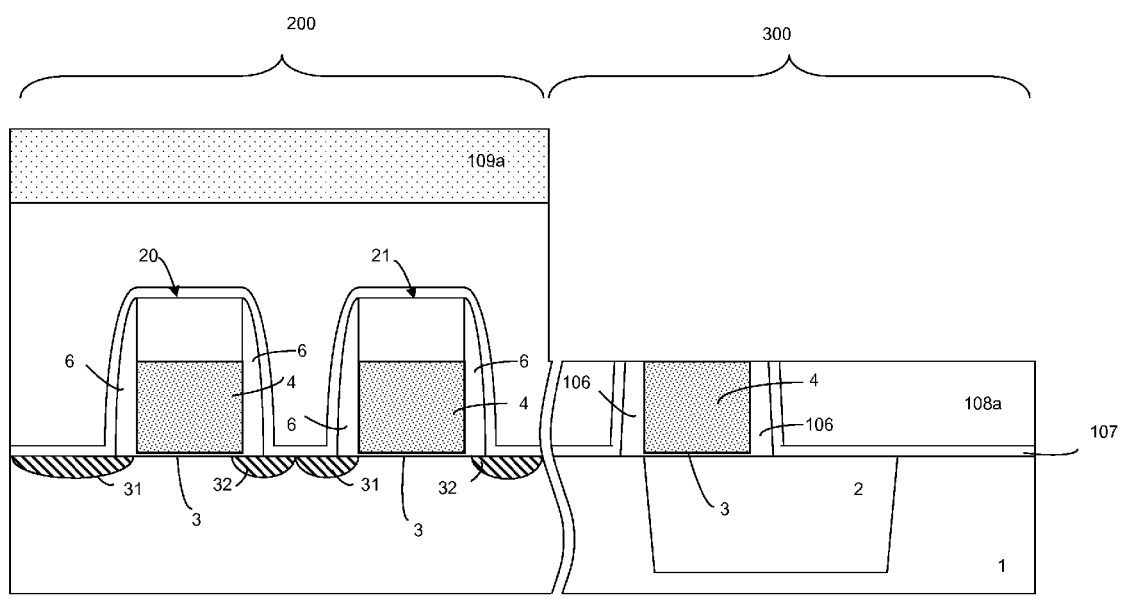
FIG. 15 shows the structure of FIG. 14 after an etch has been performed in accordance with an embodiment of the present invention.

Hard mask 5 is then removed from each gate structure 22 in non-core region 300. Referring now to FIG. 14, hard mask 5 can be removed by first depositing sacrificial dielectric film 108 over barrier layer 107. In the present embodiment dielectric film 108 includes one or more layers of dielectric material, with individual layers formed of doped oxide, BPSG, USG, SOG, BSG, PSG or TEOS. In one specific embodiment a chemical mechanical polishing process is used to planarize the deposited dielectric material so as to form a planarized dielectric film 108 having a thickness of from 0 to 3000 Angstroms over the top of gate structures 20-22.

A layer of photoresist is then deposited, exposed and developed to form resist mask 109a that covers core region 200. In the present embodiment all of core region 200 is covered by resist mask 109a while all of non-core region 300 is exposed.

An etch step is performed so as to remove hard mask 5 from each gate structure 22 in non-core region 300, exposing conductive layer 4 of each gate structure 22 in non-core region 300. This etch will also remove some of that portion of sacrificial dielectric film 108 that is not covered by resist mask 109a, leaving remaining dielectric film 108a. Also, the etch process removes portions of barrier layer 107 and removes the tops of those spacers 6 that are not covered by resist mask 109a. In the present embodiment a selective etch process is used that will preferentially remove dielectric film 108 and hard mask 5 over the conductive material in conductive layer 4. In one embodiment a plasma or dry etch process is used that will stop at the top surface of conductive layer 4. In one embodiment a fluorine based etch is performed in a dielectric-etch chamber that uses tetrafluoromethane ($CF_4$) and/or other fluorine-based chemistries (e.g., $CHF_3$, $O_2$, Ar, $C_4F_8$, $C_5F_8$, $N_2$, $CH_2F_2$, $CH_3F$, CO, $C_2HF_5$, and $C_2F_6$) that is tuned to obtain a high etch rate of doped oxide (dielectric film 108) and oxynitride (hard mask 5), and a low etch rate of polysilicon (conductive layer 4).

Remaining dielectric film 108a with non-core region 300 is then removed using a wet etch process. In the embodiment shown in FIG. 16 the etch forms gate structure 122a in non-core region 300 that includes remaining spacers 106a and barrier spacers 107b that extend on opposite sides of remaining spacers 106a. In the present embodiment a wet etch process is used that preferentially etches remaining dielectric film 108a over semiconductor 1 and the other structures formed on semiconductor 1 (spacers 106a, hard mask 5, conductive layer 4, and shallow trench isolation region 2). In the present embodiment a dilute HF or BOE solution is used so as to obtain a high etch rate of doped oxide (remaining dielectric layer 108a) and a very low etch rate of: silicon (substrate 1), silicon nitride (spacers 106a and 107b), nitride (hard mask 5), polysilicon (conductive layer 4), and undoped oxide (shallow trench isolation region 2).

Following the removal of resist mask 109a implant process steps are performed so as to implant species within non-core region 300 as required to meet device and integration requirements. In the present embodiment non-core region 300 is covered with one or more photoresist masks and both N type and P type dopants are implanted so as to form both N type gate structures and P type gate structures, and to form source and drain regions 133-134 within non-core region 300.

A salicide process is then performed. Remaining barrier layer 107a and remaining dielectric film 108b block salicidation in core region 200 such that the salicidation process only forms silicide segments 111-113 in non-core region 300. Silicide segments 111-113 can be formed in the same manner as silicide segments 11-13 shown in FIGS. 6-10, forming a gate electrode that includes silicide segment 112 and conductive layer 4.

Figure 17:
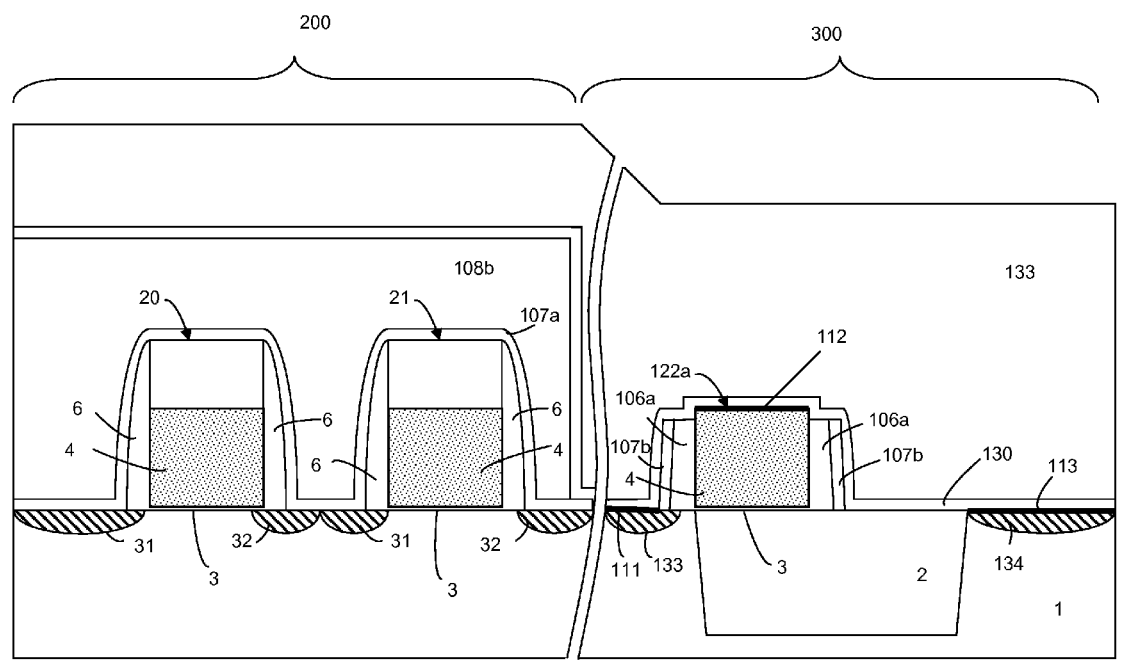
FIG. 17 shows the structure of FIG. 16 after the resist mask has been removed and after implant processes have been performed, after a salicide process has been performed, and after one or more dielectric layers have been deposited in accordance with an embodiment of the present invention.
Figure 18:
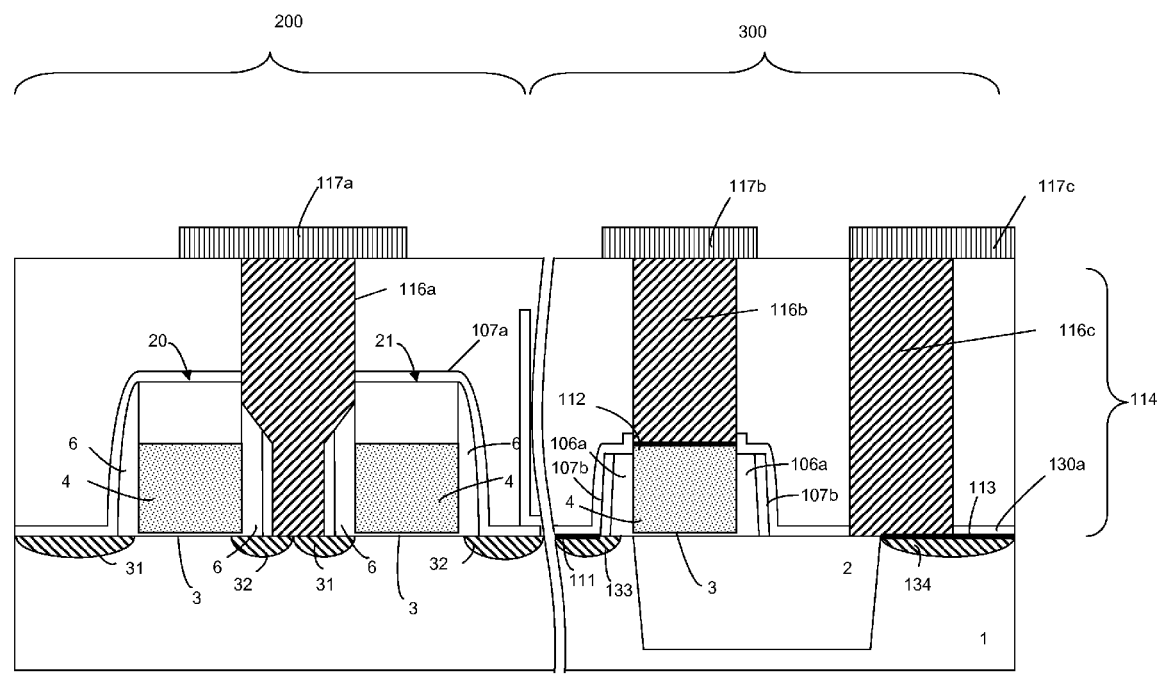
FIG. 18 shows the structure of FIG. 17 after completion of the pre-metal dielectric film and after self-aligned openings have been formed in the core region, non-self aligned openings have been formed in the non-core region, and after self aligned contacts have been formed in the core region and non-self aligned contacts have been formed in the non-core region, and after interconnects have been formed in accordance with an embodiment of the present invention.

In the embodiment shown in FIGS. 17-18 pre-metal dielectric film 114 is formed by depositing dielectric layer 130 over semiconductor substrate 1. In one embodiment dielectric layer 130 has a thickness of from 100-500 Angstroms and includes one or more layers, with each layer formed of silicon nitride, silicon oxide or silicon oxynitride. A dielectric layer 133 is then deposited over dielectric layer 130. Dielectric layer 133 can include one or more layers of dielectric material, with each layer formed of doped oxide, BPSG, USG, BSG, PSG. A chemical mechanical polishing process is then performed to planarize the top surface, removing that portion of dielectric layer 130 that extends within core region 200. One or more layers of relatively hard dielectric material such as TEOS and/or silicon oxynitride can then be deposited to form a dielectric film 114 having a hard upper surface. The resulting pre-metal dielectric film 114 will include remaining dielectric film 108b, remaining dielectric layer 130a, and the hard dielectric material deposited over the planarized structure.

Openings are formed in dielectric film 114 and barrier layer 107a, contacts 116a-c are formed in the openings, and interconnects 117a-c are formed that electrically couple to interconnects 116a-c. In the present embodiment openings, contacts 116a-c and interconnects 117a-c are formed using the same methods and materials as openings 15a-c, interconnects 16a-c, and interconnects 17a-c shown in FIGS. 1-10. The resulting structure will include self-aligned contact 116a that is formed using a self-aligned contact process and that electrically couples to source and drain regions 31-32, and contacts 116 b-c that electrically couple to silicide segments 112-113.

Figure 16:
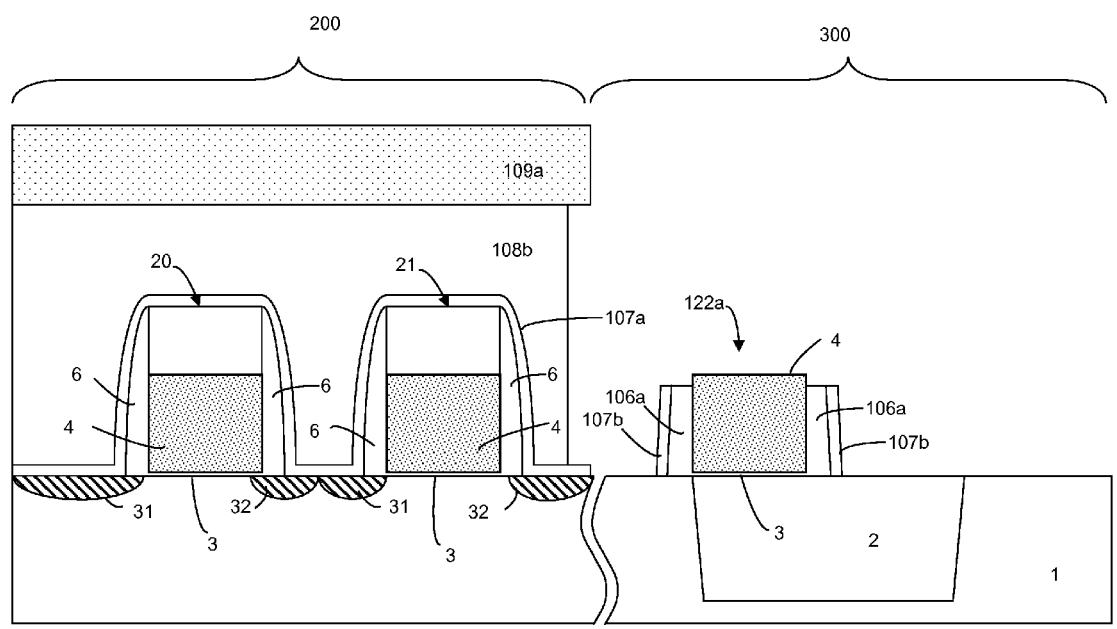
FIG. 16 shows the structure of FIG. 15 after a selective etch has been performed to remove that portion of the remaining dielectric film that extends within the non-core region in accordance with an embodiment of the present invention.

FIGS. 19-22 illustrate a method for forming CMOS devices that include self-aligned contacts in core region 200 and forming CMOS devices in non-core region 300 using a salicide process, in which a dielectric barrier layer 107 is the protective layer that is used to block salicidation, and in which barrier spacers are formed in core region 200. In this embodiment gate structures 20-21 and 122a, and source and drain structures 31-32 are formed in the same manner as illustrated in FIGS. 13-16. Then resist mask 109a and remaining dielectric film 108b, shown in FIG. 16 are removed. In the present embodiment a wet etch process is used that preferentially etches remaining dielectric film 108b over semiconductor 1 and the other structures formed on semiconductor 1 (remaining barrier layer 107a-b, remaining spacers 106a, conductive layer 4, and shallow trench isolation region 2) such as a dilute HF or BOE wet etch solution.

Implant process steps are performed so as to implant species within non-core region 300 as required to meet device and integration requirements. In the present embodiment non-core region 300 is covered with one or more photoresist masks and both N type and P type dopants are implanted so as to form both N type gate structures and P type gate structures, and to form source and drain regions 133-134 within non-core region 300.

Figure 19:
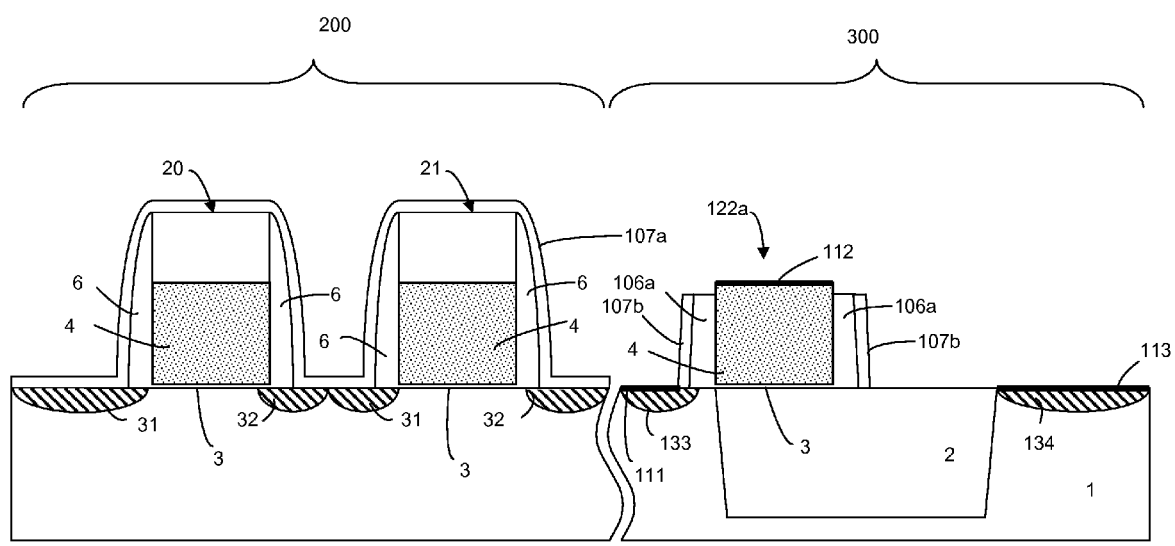
FIG. 19 shows the structure of FIG. 16 after removal of the resist mask, after a selective etch has been performed so as to remove the remaining dielectric film, after implant process steps have been performed and after a salicide process has been performed in accordance with an embodiment of the present invention.

A salicide process is then performed. Referring now to FIG. 19, remaining barrier layer 107a forms a protective layer that blocks salicidation in core region 200 such that the salicidation process only forms a salicide layer in non-core region 300. The salicide process can be performed using the same processes and materials as the salicide process of FIG. 6, forming silicide segments 111-113.

Figure 20:
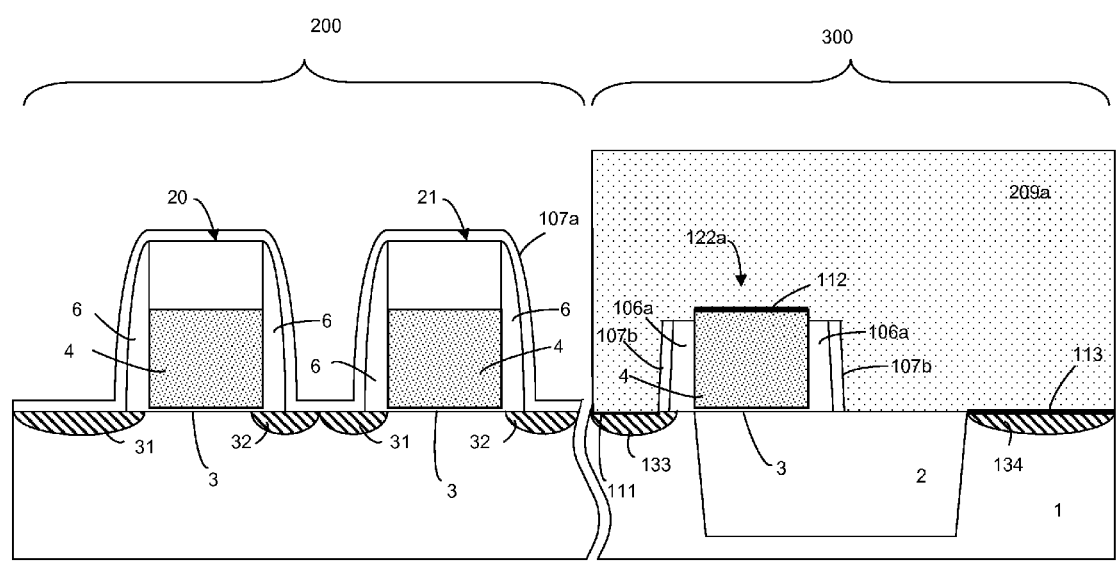
FIG. 20 shows the structure of FIG. 19 after a resist mask has been formed thereover that covers all of the non-core region and that exposes all of the core region in accordance with an embodiment of the present invention.

Referring now to FIG. 20, resist mask 209a is formed that covers non-core region 300, exposing remaining barrier layer 107a. Resist mask 209a can be formed using a reverse tone mask of the mask that is used to form resist mask 109a or by using the same mask and a negative resist. An etch process is then performed to remove some of remaining barrier layer 107a, forming barrier spacers 206 that directly adjoin spacers 6. In the present embodiment barrier layer 107a is silicon nitride, and a reactive ion etch is used to form barrier spacers 206.

A barrier layer 207 is deposited such that it extends over all of semiconductor substrate 1, directly overlying each of barrier spacers 206 and gate structure 122a. Barrier layer 207 can be one or more layers of dielectric material, with each layer formed of silicon nitride, silicon oxide, silicon oxynitride, or other dielectric material that can act as an etch stop relative to the material in pre-metal dielectric film 214. In one specific embodiment barrier layer 207 is a single layer of nitride that has a thickness of from 100-500 Angstroms and that extends over the entire semiconductor substrate.

Figure 21:
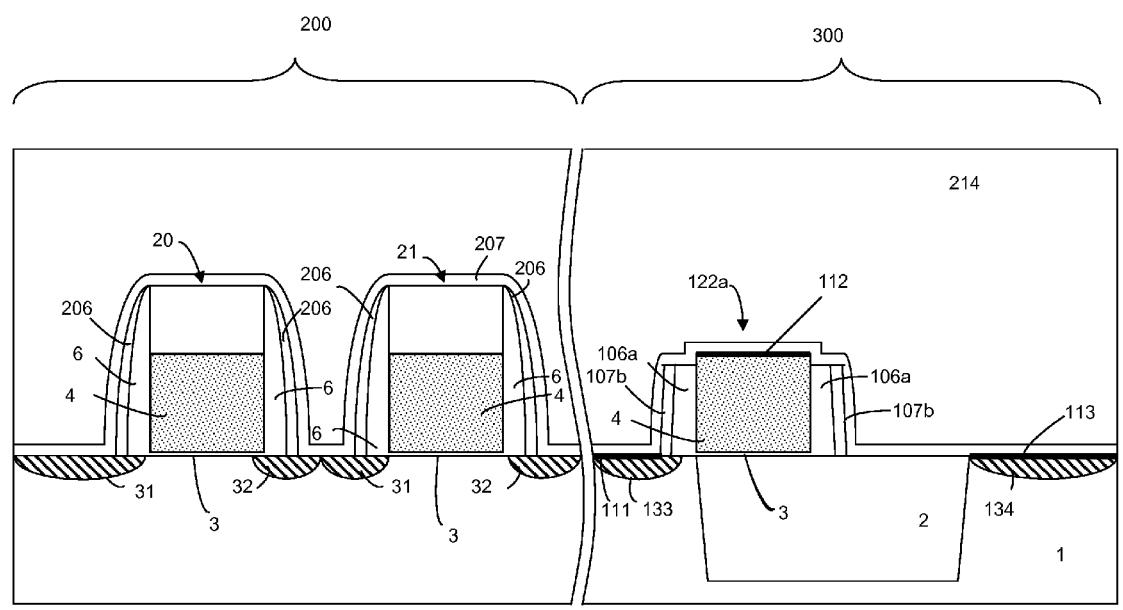
FIG. 21 shows the structure of FIG. 20 after an etch has been performed so as to remove portions of remaining barrier layer and form barrier spacers, after the resist mask has been removed, and after a barrier layer and a pre-metal dielectric film have been formed thereover in accordance with an embodiment of the present invention.
Figure 22:
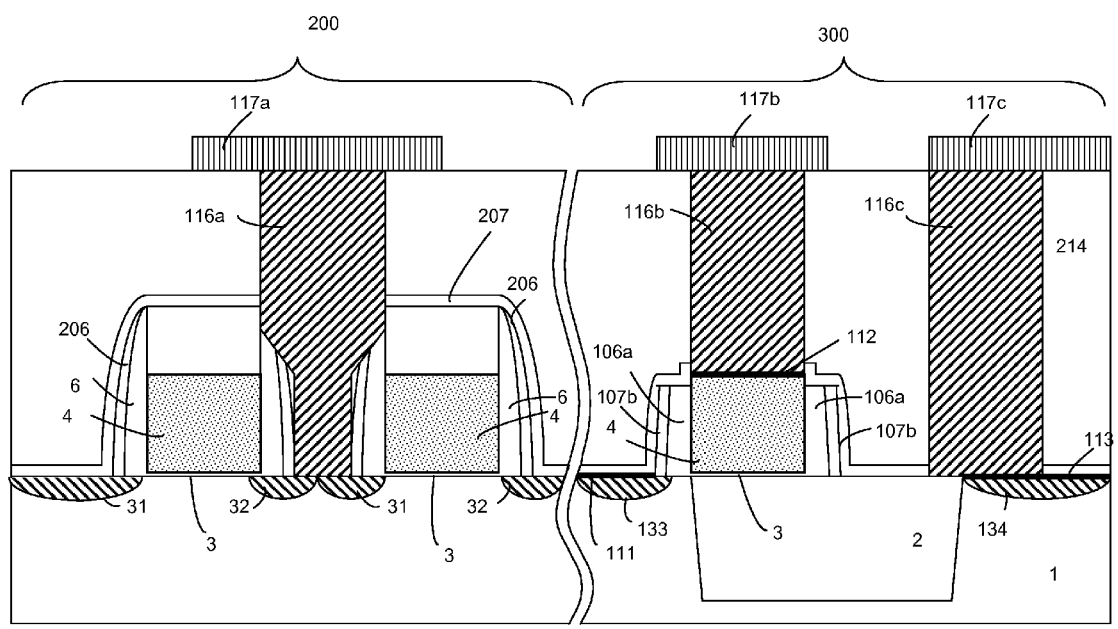
FIG. 22 shows the structure of FIG. 21 after self-aligned contacts have been formed that couple to source and drain regions in the core region, after non-self aligned contacts have been formed the non-core region, and after interconnects have been formed thereover in accordance with an embodiment of the present invention The drawings referred to in this description should be understood as not being drawn to scale.

As shown in FIG. 21 a pre-metal dielectric film 214 is formed such that pre-metal dielectric film 214 extends over all of semiconductor substrate 1. Accordingly, pre-metal dielectric film 214 will directly overlie barrier layer 207. Contact openings are formed, contacts 116a-c are formed in the openings, and interconnects 117a-c are formed. In the present embodiment dielectric film 214, contact openings in dielectric film 214, contacts 116a-c and interconnects 117a-c are formed using the same methods and materials as are used to form dielectric film 14, openings 15a-c, interconnects 16a-c and interconnects 17a-c shown in FIGS. 1-10. The resulting structure will include self-aligned contact 116a that is formed using a self-aligned contact process and contacts 116 b-c that couple to silicide segments 112-113.

In the present embodiment the methods of FIGS. 1-22 are used to form a plurality of CMOS devices on a semiconductor substrate which is then singulated to form individual die, with each die forming an individual CMOS semiconductor device that includes a core region 200 and a non-core region 300. In one embodiment each die includes a core region 200 that is a memory core of substantially replicated cells, with each cell formed of devices that can be used for storing data (memory devices) and includes a non-core region 300 that includes control logic that is electrically coupled to core region 200 for controlling the storage and retrieval of data in core region 200.

In one specific embodiment all of the devices in core region 200 are N type devices that form memory cells. In this embodiment non-core region 300 includes both N type devices and P type devices that primarily perform control logic functions and are electrically coupled to the N type devices in core region 200 for controlling the storage and retrieval of data. However, it is appreciated that non-core region 300 can include circuitry for performing other functions, including memory storage, that may be required of a particular CMOS device.

In one embodiment, core region 200 is a memory core and non-core region 300 includes circuitry that performs all functions other than the memory storage and retrieval functions performed by core region 200. The term "non-core region," as used in the present application, indicates a region of the semiconductor substrate that is not within the core region.

This region can be located anywhere on the semiconductor substrate other than in the core region and does not have to extend around the core region or directly adjoin the core region. In the present embodiment each die includes only a single core region and a single non-core region. However, alternatively, each die could include multiple core regions and/or multiple non-core regions.

In one embodiment a CMOS device is formed that includes a memory core and a periphery region. In this embodiment core region 200 encompasses the entire memory core of the CMOS device and non-core region 300 encompasses the entire periphery region. In this embodiment core region 200 includes only devices that include self-aligned contacts for connection to source and drain regions and gate contacts that are conventional contacts (not self-aligned contacts). The non-core region includes only conventional contacts (e.g., contacts 116 b-c that are not self-aligned) that couple to gate structures and source and drain regions. This gives a CMOS device that includes a memory core having only devices that include self-aligned contacts for connection to source and drain regions and a periphery region that includes only devices that couple to gate structures and source and drain regions using conventional contacts. Moreover, this CMOS device will include self-aligned contacts only within the memory core and no self-aligned contacts will be formed in the periphery region.

In another embodiment a CMOS device is formed that includes a memory core and a periphery region, with the memory core including all of core region 200 and some of non-core region 300. When core region 200 includes only devices that include self-aligned contacts for connection to source and drain regions and non-core region 300 includes only conventional contacts (e.g., contacts 116 b-c that are not self-aligned) that couple to source and drain regions and gate structures, this gives a CMOS device that includes a memory core having both self-aligned contacts and conventional contacts for connection to source and drain structures, and having a periphery region with only conventional contacts for connection to gate structures and source and drain regions. Accordingly, this embodiment will include both self-aligned contacts and conventional contacts for coupling to source and drain structures in the memory core and only conventional contacts in the periphery region.

In the present embodiment the gate structures within core region 200 are more closely spaced than the gate structures within non-core region 300. In one embodiment the gate structures are so closely spaced that self-aligned contact process are required for assuring that contacts to source and drain structures in core region 200 do not short to adjoining gate electrodes. This close spacing of gate structures gives high device density in core region 200. The use of a salicide process in non-core region 300 gives CMOS devices that are less dense, but which have high speed. Also, the use of a salicide process allows for the formation of low voltage CMOS devices in non-core region 300.

The preferred embodiments of the present invention are thus described. While the present invention has been described in particular embodiments, it should be appreciated that the present invention should not be construed as limited by such embodiments, but rather construed according to the following claims.

What is claimed is:

1. A method for forming complimentary metal oxide semiconductor (CMOS) devices on a semiconductor substrate comprising:
   forming gate structures within a first region and within a second region of the semiconductor substrate, the gate structures including a conductive layer and a hard mask that overlies the conductive layer;
   forming a first dielectric layer that extends over the gate structures; and
   performing a first etch process so as to remove the hard mask from the gate structures in the second region of the semiconductor substrate and expose the conductive layer, the first etch process removing portions of the first dielectric layer and exposing some of the top surface of the semiconductor substrate in the second region;
   performing a salicide process so as to form a plurality of silicide segments in the second region of the semiconductor substrate;
   forming self-aligned contacts within the first region of the semiconductor substrate; and
   forming contacts within the second region of the semiconductor substrate that are not self-aligned contacts.

2. The method of claim 1 wherein the gate structures include spacers, remaining portions of the first dielectric layer forming a first set of additional spacers in the second region, each spacer in the first set of additional spacers immediately adjoining one of the spacers in the second region.

3. A method for forming complimentary metal oxide semiconductor (CMOS) devices on a semiconductor substrate comprising:
   forming gate structures within a first region and within a second region of the semiconductor substrate, the gate structures including a conductive layer that overlies the first dielectric layer and a hard mask that overlies the conductive layer;
   forming a first dielectric layer on the semiconductor substrate such that the first dielectric layer overlies the gate structures; and
   forming a second dielectric layer that extends over the first dielectric layer;
   performing a first etch process so as to remove the hard mask from the gate structures in the second region of the semiconductor substrate and expose the conductive layer, the first etch process removing portions of the second dielectric layer and portions of the first dielectric layer so as to expose some of the top surface of the semiconductor substrate in the second region;
   performing a salicide process so as to form a plurality of silicide segments in the second region of the semiconductor substrate;
   depositing additional dielectric material, the remaining portion of the second dielectric layer and the additional dielectric material forming a pre-metal dielectric film that immediately overlies the first dielectric layer in the first region; and
   forming self-aligned contacts within the first region of the semiconductor substrate.

4. The method of claim 3 wherein the gate structures include spacers, remaining portions of the first dielectric layer forming a first set of additional spacers in the second region, each spacer in the first set of additional spacers immediately adjoining one of the spacers in the second region.

5. The method of claim 3 wherein the silicide segments include silicide segments that extend over the conductive layer and silicide segments that extend over the top surface of the semiconductor substrate.

6. The method of claim 3 wherein the first etch process further includes a first selective etch and a second selective etch, the first selective etch removing those portions of the first and second dielectric layers that extend over the hard mask, and the second selective etch removing some of the remaining first dielectric layer and second dielectric layer to expose some of the top surface of the semiconductor substrate in the second region.

7. The method of claim 3 wherein the first dielectric layer is formed of a material that can be selective etched relative to the pre-metal dielectric layer.

8. The method of claim 3 wherein forming self-aligned contacts within the first region of the semiconductor substrate further comprises:
performing a first selective etch that preferentially removes the pre-metal dielectric film over the first dielectric layer, so as to form an opening that extends through the pre-metal dielectric film to expose a portion of the first dielectric layer;
performing a second selective etch that preferentially removes the first dielectric layer over the pre-metal dielectric film so as to extend the opening through the first dielectric layer; and
filling the opening with conductive material so as to form the self-aligned contact.

9. The method of claim 3 wherein the first dielectric layer is selected from the group consisting of silicon nitride, silicon oxide and silicon oxynitride.

10. The method of claim 9 wherein the pre-metal dielectric layer comprises one or more layers that are selected from the group consisting of doped oxide, borophosphosilica glass (BPSG), undoped silica glass (USG), spin on glass (SOG), borosilica glass (BSG), phosphosilicate glass (PSG) and tetraethylorthosilicate (TEOS).

11. A method for forming complimentary metal oxide semiconductor (CMOS) devices on a semiconductor substrate comprising:
forming gate structures within a first region and within a second region of the semiconductor substrate, the gate structures including a conductive layer and a hard mask that overlies the conductive layer;
forming a first dielectric layer on the semiconductor substrate such that the first dielectric layer overlies the gate structures;
forming a second dielectric layer that extends over the first dielectric layer;
performing a first etch process so as to remove the hard mask from the gate structures in the second region of the semiconductor substrate and expose the conductive layer, the first etch process removing portions of the second dielectric layer and portions of the first dielectric layer so as to expose some of the top surface of the semiconductor substrate in the second region;
performing a salicide process so as to form a plurality of silicide segments in the second region of the semiconductor substrate; and
forming self-aligned contacts within the first region of the semiconductor substrate.

12. The method of claim 11 wherein the gate structures include spacers, the first etch forming a first set of additional spacers, each spacer in the first set of additional spacers immediately adjoining one of the spacers in the second region.

13. The method of claim 12 further comprising performing a second etch process to remove portions of the first dielectric layer in the first region, the second etch process forming a second set of additional spacers that immediately adjoin spacers in the first region.

14. The method of claim 13 further comprising:
depositing a third dielectric layer over the semiconductor substrate; and
depositing a pre-metal dielectric film over the third dielectric layer, wherein the pre-metal dielectric film comprises one or more layers of material that can be selectively etched relative to the material in the third dielectric layer.

15. The method of claim 14 wherein forming self-aligned contacts within the first region of the semiconductor substrate further comprises:
performing a first selective etch that preferentially removes the pre-metal dielectric film over the third dielectric layer, so as to form an opening that extends through the pre-metal dielectric film to expose a portion of the third dielectric layer;
performing a second selective etch that preferentially removes the third dielectric layer over the pre-metal dielectric film so as to extend the opening through the third dielectric layer; and
filling the opening with conductive material so as to form the self-aligned contact.

16. The method of claim 11 wherein the first dielectric layer and the third dielectric layer are selected from the group consisting of silicon nitride, silicon oxide and silicon oxynitride.

17. The method of claim 11 wherein the silicide segments include silicide segments that extend over the conductive layer and silicide segments that extend over the top surface of the semiconductor substrate.

18. The method of claim 11 wherein the first etch process further includes a first selective etch and a second selective etch, the first selective etch removing those portions of the first and second dielectric layers that extend over the hard mask, and the second selective etch removing some of the remaining first dielectric layer and second dielectric layer to expose some of the top surface of the semiconductor substrate in the second region.

19. The method of claim 11 wherein the CMOS device includes a memory core of substantially replicated cells and includes a periphery region that includes control logic, the first region extending entirely within the memory core, and the second region extending entirely within the periphery region.

20. The method of claim 11 wherein the CMOS device includes a memory core of substantially replicated cells and includes a periphery region that includes control logic, the first region extending entirely within the memory core, and the second region extending partially within the memory core and partially within the periphery region.

* * * * *